United States Patent
Bauer et al.

(10) Patent No.: US 8,173,488 B2
(45) Date of Patent: May 8, 2012

(54) ELECTRONIC DEVICE AND METHOD OF MANUFACTURING SAME

(75) Inventors: Michael Bauer, Nittendorf (DE); Ludwig Heitzer, Falkenfels (DE); Daniel Porwol, Straubing (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 12/241,093

(22) Filed: Sep. 30, 2008

(65) Prior Publication Data

US 2010/0078822 A1  Apr. 1, 2010

(51) Int. Cl.
*H01L 21/44* (2006.01)
*H01L 23/22* (2006.01)

(52) U.S. Cl. ........ 438/110; 438/118; 438/124; 438/127; 257/687; 257/724; 257/787; 257/E23.001; 257/E21.502

(58) Field of Classification Search .......... 438/106–108, 438/110, 118, 124, 127; 257/678, 687, 723, 257/724, 787
See application file for complete search history.

(56) References Cited

U.S. PATENT DOCUMENTS

| | | | |
|---|---|---|---|
| 5,959,462 A * | 9/1999 | Lum | 324/750.05 |
| 6,787,394 B2 * | 9/2004 | Farnworth | 438/114 |
| 7,112,467 B2 | 9/2006 | Eichelberger | |
| 7,563,652 B2 * | 7/2009 | Yang et al. | 438/126 |
| 2008/0009102 A1 * | 1/2008 | Yang et al. | 438/126 |
| 2009/0075428 A1 * | 3/2009 | Tang et al. | 438/114 |
| 2009/0085186 A1 * | 4/2009 | Meyer | 257/690 |

OTHER PUBLICATIONS

Brunnbauer et al., "Embedded Wafer Level Ball Grid Array (eWLB)"; 2006 Electronics Packaging Technology Conference, IEEE (5 pages).

* cited by examiner

*Primary Examiner* — Hsien Ming Lee
(74) *Attorney, Agent, or Firm* — SpryIP, LLC

(57) ABSTRACT

This application relates to a method of manufacturing a semiconductor device comprising: providing multiple chips each comprising contact elements on a first main face of each of the multiple chips, and a first layer applied to each of the first main faces of the multiple chips; placing the multiple chips over a carrier with the first layers facing the carrier; applying encapsulation material to the multiple chips and the carrier to form an encapsulation workpiece embedding the multiple chips; and removing the carrier from the encapsulation workpiece.

16 Claims, 6 Drawing Sheets

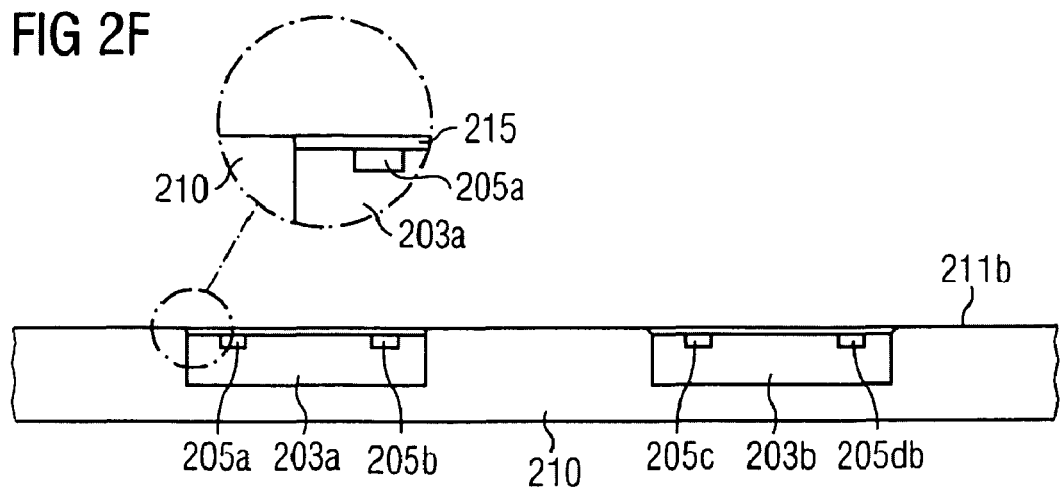
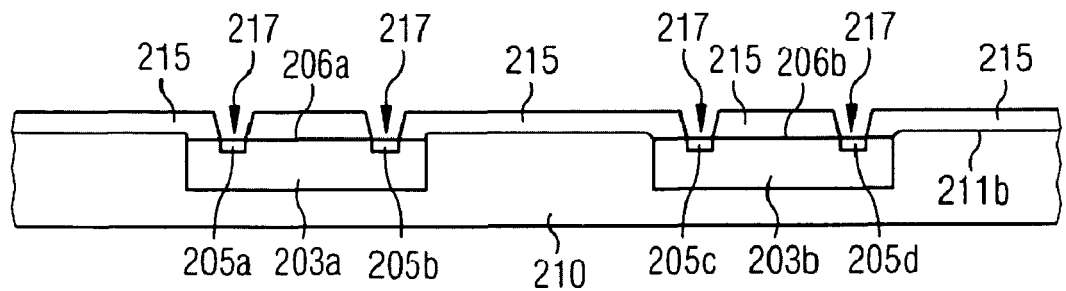
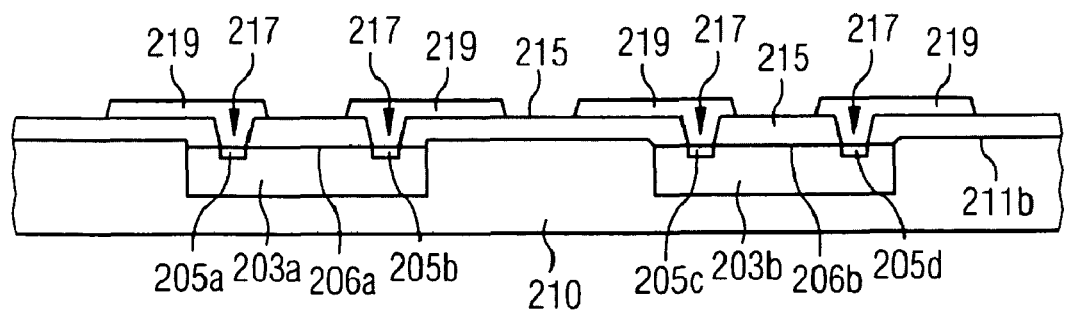

ELECTRONIC DEVICE AND METHOD OF MANUFACTURING SAME

FIELD OF INVENTION

The present invention relates to a semiconductor device and methods of manufacturing semiconductor devices.

BACKGROUND

Semiconductor chips can be used as substrates for integrating highly sensitive devices like electronic circuits, sensors, micro-electromechanical systems, laser diodes, and the like. In order to protect the highly sensitive devices against environmental stress caused by humidity, chemical processes, mechanical destruction, and the like, semiconductor chips are often encapsulated in encapsulation material. The application of encapsulation material to semiconductor chips, however, may create various problems.

SUMMARY

Accordingly, there is provided a method of manufacturing a semiconductor device comprising: providing multiple chips each comprising contact elements on a first main face of each of the multiple chips, and a first layer applied to each of the first main faces of the multiple chips; placing the multiple chips over a carrier with the first layers facing the carrier; applying encapsulation material to the multiple chips and the carrier to form an encapsulation workpiece embedding the multiple chips; and removing the carrier from the encapsulation workpiece.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A-1G schematically illustrate an embodiment of a method of manufacturing semiconductor devices wherein a first layer is applied to first main faces of multiple chips, and wherein the multiple chips are placed over a carrier with the first main faces facing the carrier.

FIGS. 2A-2K schematically illustrate an embodiment of a method of manufacturing semiconductor devices wherein a first layer is applied to first main faces of multiple chips, wherein the multiple chips are placed over a carrier with the first main faces facing the carrier, and wherein a first metal layer is applied over the multiple chips.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein. Therefore, it is intended that this invention be limited only by the claims and the equivalents thereof.

FIGS. 1A-1E depict an embodiment of a method of manufacturing multiple semiconductor devices 100*a*, 100*b*, and an embodiment of the semiconductor devices 100*a*, 100*b*.

FIG. 1A depicts a wafer 103 comprising multiple chips 103*a*, 103*b*, 103*c*. In one embodiment, wafer 103 is a semiconductor wafer, e.g. a silicon wafer. Silicon wafers usually have standard diameters, e.g., 2 inch, 4 inch, 8 inch, 12 inch 18 inch, and thicknesses in the range of 10 micrometer to 1000 micrometer, depending on the application.

Each of the chips 103*a*-103*c* may contain components like an integrated circuit, a sensor, a radiation emitter, or a combination thereof. Known semiconductor sensors are pressure sensors, optical sensors, acoustic sensors, gas sensors, and the like. Radiation emitters may be laser diodes, antennas, and the like. FIG. 1A also depicts multiple contact elements 105*a*-105*f* on a first main face 106 of wafer 103 that can be used to electrically connect the chip components with external voltages or current sources.

FIG. 1A further depicts first layer 107 applied to first main face 106 of wafer 103. First layer 107 may be a foil attached to wafer 103, an adhesive tape, a polymer layer, or any other material that later can be structured or removed from first main face 106. The thickness of first layer 107 depends on the application and may vary between, say, 2 micrometer and 100 micrometer. In one embodiment, the layer thickness is in a range between 10 and 20 micrometer. In one embodiment, first layer 107 is applied to first main face 106 by spinning a coating material over wafer 103. In one embodiment, the spun coating material is a polymer, for example a photosensitive material e.g. Polyimide, or thermoplastic material e.g. PMMA. In another embodiment, first layer 107 is applied by attaching an adhesive foil to the first main face 106 of wafer 103.

FIG. 1A depicts wafer 103 before singulation. That is, before singulation, chips 103*a*-103*c* are integral with the semiconductor mono-crystal that makes up wafer 103. Singulation of wafer 103 may be carried out by sawing, etching or laser cutting through wafer 103 along sawing streets 105 until individual chips 103*a*, 103*b*, 103*c* covered with individual first layer elements 106*a*, 106*b*, 106*c* are obtained. For simplicity, the first layer elements 106*a*, 106*b*, 106*b* will be called "first layers 106*a*, 106*b*, 106*c*" in the following description. The sawing streets 105 are aligned between adjacent chips 103*a*, 103*b*, 103*c*. Depending on the size of the components, adjacent sawing streets are spaced apart at a distance of, say, 1 to 20 millimetres so that the singulated chips have an area of, say, 1 to 1000 square millimetres. In one embodiment, the multiple chips 103*a*, 103*b*, 103*c* are the same chips with the same components and the same size. In another embodiment, the multiple chips have different components and/or different sizes. Generally, the various ways of singulating a wafer are well known in the art and will not be explained here in more detail.

FIG. 1B depicts the multiple chips 103*a*, 103*b* after singulation of wafer 103 and after being placed on carrier 109 with the first layers 107*a*, 107*b* facing the carrier. Due to first layers 107*a*, 107*b*, the first main faces 106*a*, 106*b* of the multiple chips 103*a*, 103*b* are protected against being scratched by the surface of carrier 109. This is since scratches on first main face 106*a*, 106*b* can easily destroy chip components like integrated circuits or sensor elements.

Typically, the multiple chips 103*a*, 103*b* are placed at spaced apart positions. In one embodiment, the multiple chips 103a, 103b are placed in an array order of columns and lines. The distance between adjacent chips may be, e.g. in a range between 1 mm and 50 mm. The placement of the multiple chips 103a, 103b may be carried out by picking the chips from the backside of singulated wafer, and placing them onto carrier 109 at predefined positions. This procedure can be done in an automated way by using so-called pick-and-place robotors.

In one embodiment, all chips 103a, 103b on carrier 109 may be taken from the same wafer. In another embodiment, chips 103a, 103b on carrier 109 may be taken from different wafers. By taking chips from different wafer, chips produced by different technologies can be placed onto the same carrier. This way, for example, it is possible to place RF-chips and a logic chips onto the same carrier to obtain hybrid semiconductor modules.

Figure 1A:
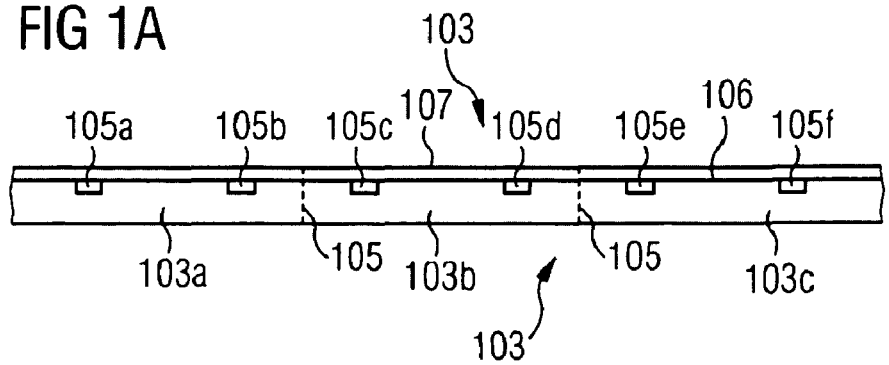
Figure 1B:
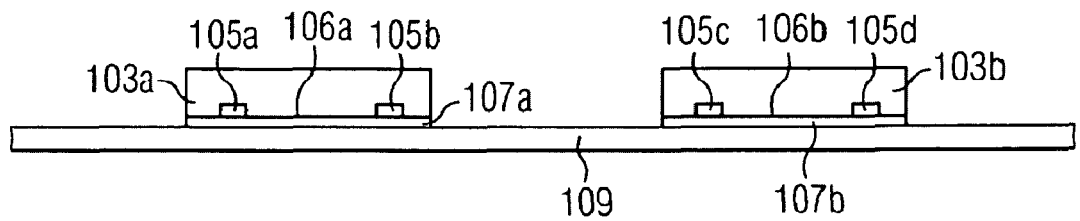

FIG. 1B depicts carrier 109 as a structure having a planar surface on the side facing the chips 103a, 103b. In one embodiment, carrier 109 is a circular or rectangular metal or plastic plate. In one embodiment, carrier 109 may be a plate covered with an adhesive tape (not shown in FIG. 1B) so that the multiple chips 103a, 103b become firmly attached to carrier 109 when being placed onto carrier 9. In one embodiment, the adhesive tape may be a release tape, e.g. a thermo-release tape, that allows for easy removal of the chips from the carrier by heating or irradiation.

Figure 1C:
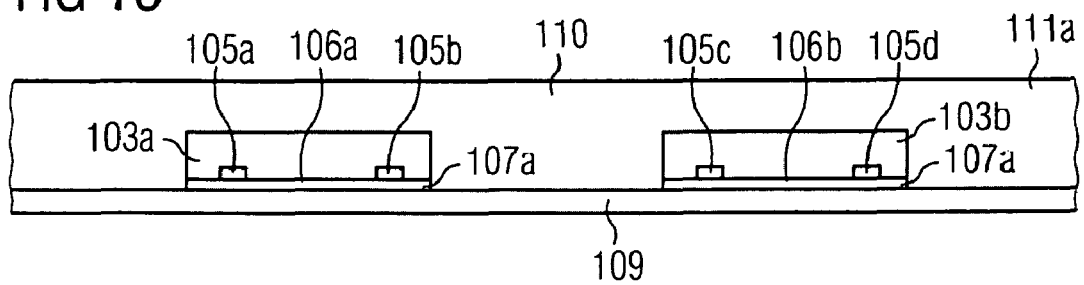

FIG. 1C depicts the multiple chips 103a, 103b on carrier 109 of FIG. 1B after encapsulation material has been applied to the multiple chips 103a, 103b and the carrier to form an encapsulation workpiece 110 embedding the multiple chips. In one embodiment, application of encapsulation material is carried out by the well known transfer molding process. For this process, carrier and chips are placed into a mold form and, subsequently, encapsulated by injecting hot mold material under pressure into the mold form.

In another embodiment, application of encapsulation material is carried out by the well known compression molding process. For this process, encapsulation material is dispensed over the chips and the carrier, and a mold form element is lowered towards the carrier to laterally distribute the encapsulation material over the carrier and the chips. In one embodiment, the mold form element has a planar surface parallel to the surface of carrier 109. In this case, encapsulation workpiece 110 is formed having an upper planar surface 111a defined by the mold form element, and a lower planar surface 111b coplanar to the upper planar surface (see FIG. 1D).

In one embodiment, carrier 109 and mold form element may form a cavity that forms a wafer-shaped encapsulation workpiece 110 embedding the multiple chips 103a, 103b. Such wafer shaped encapsulation workpiece is also known as "reconfigured wafer", or "reconstituted wafer". The thickness of such reconfigured wafer 110 may be in a range of, say, 200 to 1000 micrometer. The diameter of the reconfigured wafer 110 may be one of the standard silicon wafer diameters, e.g. 4 inch, 8 inch, or 12 inch. In this case, reconfigured wafer 110 may be handled and processed by the same machines that handle standard silicon wafers. FIG. 1C depicts reconfigured wafer 110 after the encapsulation material has solidified, and after the mold form element has been raised so that upper planar surface 111a is exposed. In one embodiment, the encapsulation material may be a polymer, or a polymer containing a filler material, e.g. silicon oxide particles, and other ingredients.

In one embodiment, carrier 109 and mold form element may form a cavity that forms a rectangular-shaped encapsulation workpiece 110 embedding the multiple chips 103a, 103b. In this case, rectangular-shaped encapsulation workpiece 110 has the shape of a plate that may be handled and processed by the same machines that handle printed circuit boards. Of course, the mold form elements may have any other shape as well, to form workpieces of shapes that are appropriate for a given application.

Figure 1D:
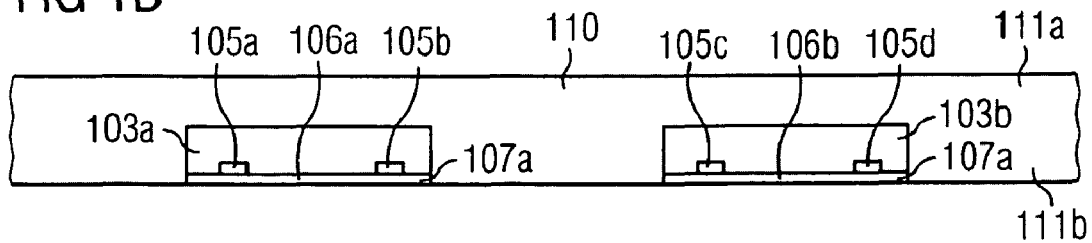

FIG. 1D depicts encapsulation workpiece 110 of FIG. 1C ("reconfigured wafer") after carrier 109 has been removed from encapsulation workpiece 110. In one embodiment, if carrier 109 has a release tape (not shown in FIG. 1C) that looses its adherence to encapsulation workpiece 110 when heated above a specified temperature, removal of carrier 109 is achieved by heating the encapsulation workpiece 110 above the specified temperature. In another embodiment, if carrier 109 is transparent and has a release tape (not shown in FIG. 1C) that looses its adherence to encapsulation workpiece 110 when irradiated by UV-light, removal of carrier 109 is achieved by irradiating the encapsulation workpiece 110 through transparent carrier 109 with UV-light. In other embodiments, carrier 109 may be removed from encapsulation workpiece 110 by mechanical force, by grinding carrier 109 off the encapsulation workpiece 110, by peeling carrier 109 off the encapsulation workpiece 110, or by etching carrier 109 away. It is noted that due to first layers 107a, 107b, the sensitive first main faces 106a, 106b of the multiple chips 103a, 103b are protected from chemical or mechanical destruction during removal of carrier 109.

Figure 1E:
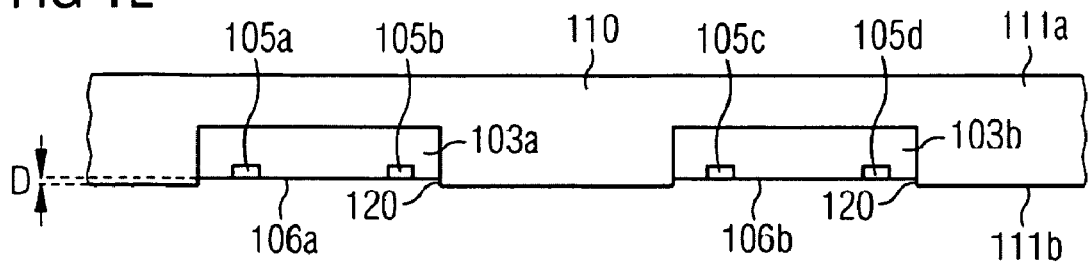

FIG. 1E depicts encapsulation workpiece 110 after first layers 107a, 107b have been removed from the first main faces 106a, 106b of the multiple chips. Removal of first layers 107a, 107b may be done in various ways depending on the type of layer. For example, if first layers 107a, 107b are adhesive foils, first layers 107a, 107b may be removed by peeling the foils off the first main faces 106a, 106b. On the other hand, if first layers 107a, 107b are made of a polymer or photoresist, first layers 107a, 107b are removed by dissolving the layer material in acetone, NMP, gamma-butyrolactone or other suitable solvent. With the removal of first layers 107a, 107b, the contact elements 105a-105d have been opened.

FIG. 1E illustrates that due to the removal of first layers 107a, 107b, a negative stand-off D of first main faces 106a, 106b of the multiple chips 103a, 103b with respect to the lower planar surface 111b of encapsulation workpiece 110 has been obtained. A negative stand-off D makes sure that the multiple chips 103a, 103b do not protrude from the lower planar surface 111b. This prevents the sensitive first main faces 106a, 106b of the multiple chips 103a, 103b from becoming touched when placing encapsulation workpiece 110 on a planar carrier. The size of stand-off D depends on the thickness of first layers 107a, 107b. Typically, the size of stand-off D is in a range between 3 to 20 micrometer.

Figure 1F:
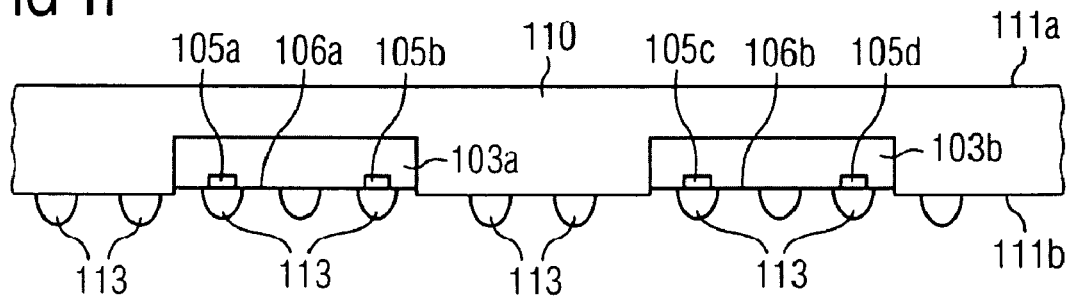

With the removal of first layers 107a, 107b, contact elements 105a-105d of the multiple chips 103a, 103b are opened to be connectable to external contact elements 113 (see FIG. 1F). In one embodiment, external contact elements 113 are provided by applying an array of external contact elements 113 to encapsulation workpiece 110. FIG. 1F depicts a two-dimensional array of external contact elements 113 applied to the lower planar surface 111b of encapsulation workpiece 110 and to first main faces 106a, 106b of the multiple chips 103a, 103b. The external contact elements 113 may be, e.g., solder balls or solder bumps that have been produced in known ways on lower planar surface 111b and the multiple chips 103a, 103b. Typical diameters of such solder balls are in a range of 200 to 650 micrometer. Due to lower the planar surface 111b provided by reconstituted wafer 110 (encapsulation workpiece), the available area for placing an array of external contact elements 113 is significantly increased compared to the area on the first main faces 106a, 106b of the multiple chips 103a, 103b only. Other embodiments on how the external contact elements 113 can be electrically connected with the multiple chips 103a, 103b will be described later.

It is noted that removal of first layers 107a, 107b may also be a partial removal. For example, first layers 107a, 107b may be partially removed by structuring first layers 107a, 107b photo-lithographically. In one embodiment, to open contact elements 105a-105d, structuring of first layers 107a, 107b may be carried out by opening first layers 107a, 107b only in regions where contact elements 105a-105d are located.

Figure 1G:
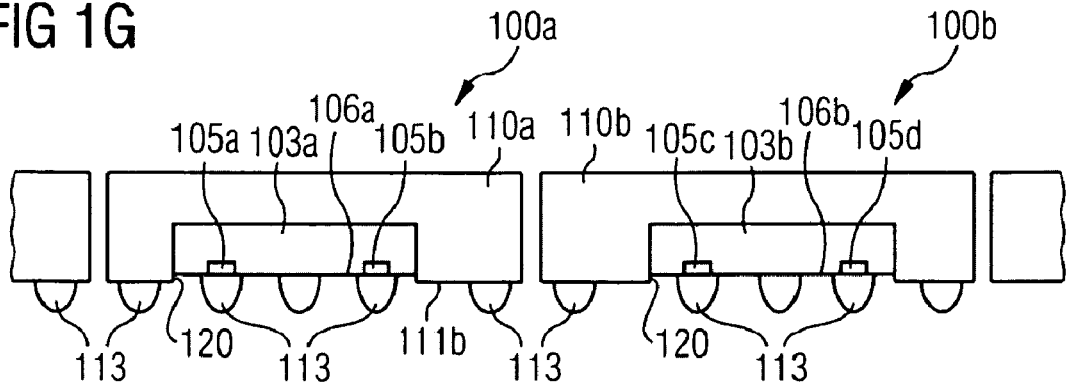

FIG. 1G depicts encapsulation workpiece 110 of FIG. 1F after singulating the encapsulation workpiece 110. By singulating the encapsulation workpiece 110, multiple independent semiconductor devices 100a, 100b are obtained. Singulation can be carried out, e.g., by sawing the encapsulation workpiece 110 into separate encapsulation elements 110a, 110b. Alternative processes for singulating are laser cutting, chemical etching, and related methods.

Each of the multiple semiconductor devices 100a, 100b, of FIG. 1G has a chip 103a, 103b that defines a first main face 106a, 106b, and contact elements 105a-105d on their first main faces. Each of the multiple semiconductor devices 100a, 100b has an encapsulation element 110a, 110b embedding the chip and defining the lower planar surface 111b. Further, for each of the multiple semiconductor devices 100a, 100b, the first main faces 106a, 106b of the multiple chips 103a, 103b have a negative stand-off D with respect to the respective lower planar surface 111b.

FIG. 1G further depicts a negative stand-off defining encapsulation step structure 120 connecting the first main faces 106a, 106b of the multiple chips 103a, 103b with the respective lower planar surface 111b. Since step structure 120 is made of encapsulation material, the step structure is usually softer than, for example, a the step structure of a protruding silicon chip edge. With a soft step structure 120, it is easier to apply a thin layer over the multiple chips 103a, 103b and the encapsulation workpiece 110 without having the layer break at the step structure 120. This may be important when fine metal layer structures are used to connect the external contact elements 113 with the contact elements 105a-105d on the multiple chips 103a, 103b.

FIG. 1G further shows the array of external contact elements 113 as being applied over the first main face of the multiple chips 103a, 103b and over the lower planar surface of the encapsulation element 110a, 110b. Alternatively, the array of external contact elements 113 may be applied to the lower planar surface of the encapsulation element 110a, 110b only. In one embodiment, the external contact elements 113 are electrically coupled with the contact elements 105a-105e of respective multiple chips 103a, 103b. In one embodiment, the electrical coupling is done by means of a structured metal layer extending over the first main faces 106a, 106b and the lower planar surface 111b.

FIGS. 2A-2K illustrate an embodiment of a method of manufacturing multiple semiconductor devices 200a, 200b, and an embodiment of semiconductor devices 200a, 200b.

Figure 2A:
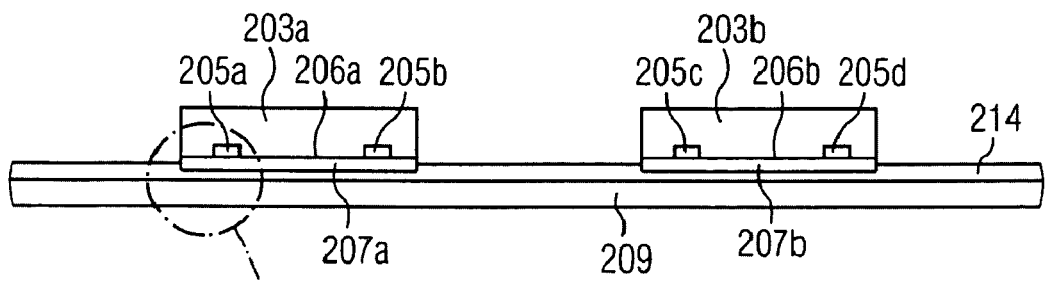
Figure 2B:
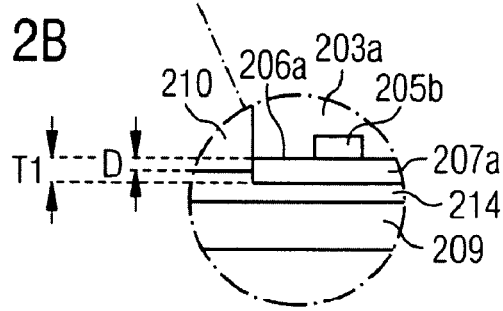

FIG. 2A depicts a carrier 209 comprising an adhesive tape 214. In one embodiment carrier 209 is comprised of a planar structure, e.g. a metal or plastic plate, to which the adhesive tape 214 is laminated. In one embodiment, adhesive tape 214 is adhesive on both sides. This way, adhesive tape 214 can be easily laminated to the planar structure of the metal or plastic plate and, at the same time, the multiple chips 203a, 203b are firmly attached to carrier 209 when placing the multiple chips 203a, 203b onto adhesive tape 214. In one embodiment, adhesive tape 214 is a thermo-release tape that releases the multiple chips 203a, 203b from carrier 209 when heated above a specified temperature. For example, Revalpha 3195V is a known release tape that looses its adhering capabilities when heated to a temperature above 180 degree Celsius. Typically, the adhesive tape 214 has a thickness in a range between 50 and 150 micrometer.

FIG. 2A further depicts multiple chips 203a, 203b placed onto adhesive tape 214. The multiple chips 203a, 203b may be the same as the ones shown in the previous figures. In particular, each of the multiple chips 203a, 203b may have contact elements 205a-205d on first main faces 206a, 206b of the multiple chips, and first layers 207a, 207b applied to the first main faces 206a, 206b. The material and thickness T1 of first layers 207a, 207b may be the same as the ones in the previous embodiments. Further, like in the previous embodiments, the multiple chips 203a, 203b are placed onto adhesive tape 214 with the first layers 207a, 207b facing the carrier 209.

Usually, the multiple chips 203a, 203b are placed by pressing the multiple chips 203a, 203b onto the soft adhesive tape 214 with a given force to make sure that the multiple chips 203a, 203b firmly adhere to the adhesive tape 214. As can be seen from blow-up figure FIG. 2B, the pressure on the multiple chips 203a, 203b causes the multiple chips 203a, 203b to lower the surface of adhesive tape 214. At the same time, due to the first layers 207a, 207b on first main faces 206a, 206b, first main faces 206a, 206b of the multiple chips 203a, 203b do not move below the original level of the surface of adhesive tape 214. This makes sure that the first main faces 206a, 206b of the multiple chips 203a, 203b will have a negative stand-off D with respect to the encapsulation workpiece 210 when covered with encapsulation material (see FIG. 2E).

Figure 2C:
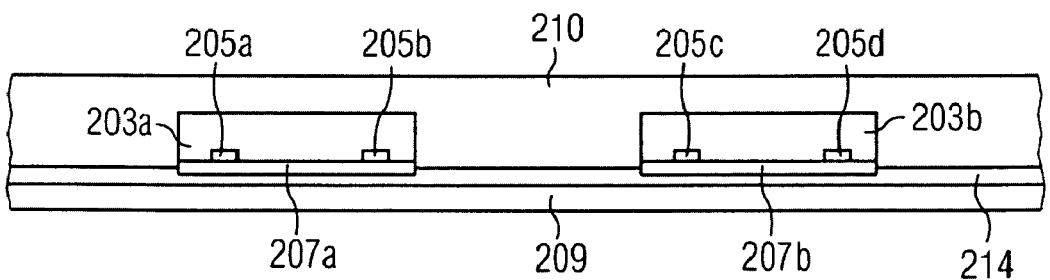

FIG. 2C depicts the multiple chips 203a, 203b and carrier 209 of FIG. 2A after encapsulation material has been applied to the multiple chips 203a, 203b and solidified in one of the ways described in the previous figures. This way, an encapsulation workpiece 210 is obtained that embeds the multiple chips 203a, 203b. Like in the embodiments described earlier, encapsulation workpiece 210 can have the shape of a silicon wafer having an upper planar surface 211a and a lower planar surface 211b. In another embodiment, encapsulation workpiece 210 may have the shape of a squared or rectangular plate having an upper planar surface 211a and a lower planar surface 211b. The larger the area of the plate, the more semiconductor devices can be manufactured in parallel (batch mode manufacturing).

Figure 2D:
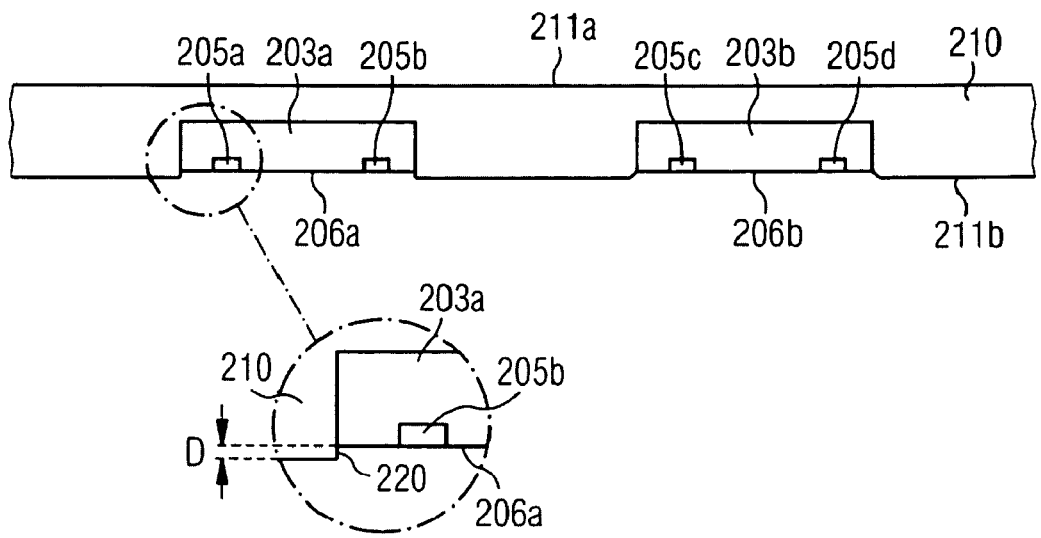

FIG. 2D depicts encapsulation workpiece 210 after carrier 209 and first layers 207a, 207b have been removed from encapsulation workpiece 210. With adhesive tape 214 being a thermo-release tape, removal of carrier 209 from multiple chips 203a, 203b can be achieved by heating carrier 209 to a temperature of about 180 degree Celsius. Then, first layers 207a, 207b are removed from multiple chips 203a, 203b. For example, if first layers 207a, 207b are made of photoresist material, first layers 207a, 207b may be removed by dissolving the photoresist in acetone, NMP, Ethyllactate or other suitable solvent. In another embodiment, removal of first layers 207a, 207b and removal of carrier 209 are carried out at the same time. By removing carrier 209 from encapsulation workpiece 210, lower planar surface 211b is exposed. By removal of first layers 207a, 207b, the multiple chips 203a, 203b are exposed as well.

As can be seen in the blow-up image of FIG. 2D, due to the removal of first layers 207a, 207b, first main faces 206a, 206b of the multiple chips 203a, 203b have a negative stand-off D with respect to lower planar surface 211b. The size of the negative stand-off D may be in a range between 5 to 50 micrometer. The negative stand-off D protects the sensitive first main faces 206a, 206b of the multiple chips 203a, 203b during handling of encapsulation workpiece 210. Further, the negative stand-off D makes it possible that lower planar surface 211b can be used as an etch-stop or grinding stop for subsequent planar machining processes without endangering the integrity of the first metal structure of the multiple chips 203a, 203b.

FIG. 2D depicts encapsulation workpiece 210 after an insulating layer 215 has been applied to the lower planar surface 211b of encapsulation workpiece 210 and to the first main faces 106a, 106b of the multiple chips 203a, 203b. Application of insulating layer 215 is carried out, for example, by a spin-on process, printing, lamination or other suitable processes. A typical thickness of insulating layer 215 is in the range of 5 to 50 micrometer.

Figure 2E:
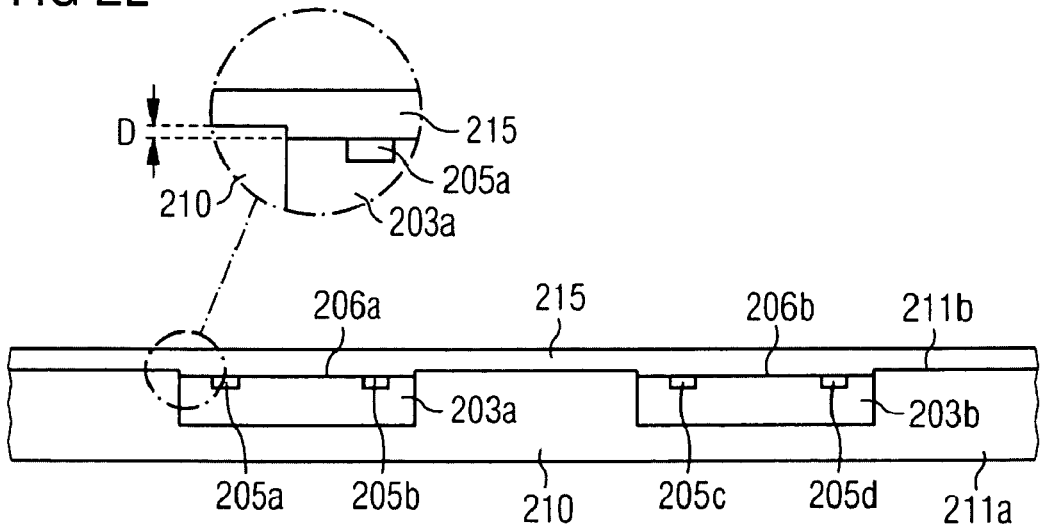

Insulating layer 215 is to provide for a planar surface for a first metal layer 219 that is to follow as a next layer over insulating layer 215 (see FIG. 2H). Further, insulating layer 215 is to provide for an electrical insulation between first metal layer 219 and the first main faces 206a, 206b of the multiple chips 203a, 203b. Blow-up image of FIG. 2E illustrates that due to the negative stand-off D, the thickness of insulating layer 215 is thicker in the region of the multiple chips 103a, 203b than in the region of lower planar surface 211b. Therefore, a good electrical insulation is provided even if the thickness of insulating layer 215 in the region of the lower planar surface 211b is very thin. In one embodiment, insulating layer 215 may be subsequently ground so that insulating layer 215 remains on the first main faces 106a, 106b of the multiple chips 203a, 203b only (see FIG. 2F).

FIG. 2G depicts encapsulation workpiece 210 of FIG. 2E after insulating layer 215 has been structured to provide first openings 217 ("vias") to the contact elements 205a-205d of the multiple chips 203a, 203b. Structuring of insulating layer 215 may be carried out by etching insulating layer 215 selectively to a mask that has been applied to insulating layer 215. In this case, the mask is removed later.

FIG. 2H depicts encapsulation workpiece 210 of FIG. 2G after a first metal layer 219 has been applied to insulating layer 215, and after structuring first metal layer 219 to obtain separate electrically conductive connections between the contact elements 205a-205d of the multiple chips 203a, 203b and the external contact elements 213. Application of first metal layer 219 may be carried out by sputtering a metal, e.g. aluminium, onto insulating layer 215. First metal layer 219 is also applied to fill first openings 217 with an electrically conducting material to electrically connect the contact elements 205a-205d of the multiple chips 203a, 203b with the external contact elements 213 that are to be applied later (see FIG. 2J). First metal layer 219 is also known as a first redistribution layer. The thickness of first metal layer 219 may be usually in a range between 5 and 25 micrometer. Structuring of first metal layer 219 may be carried out by etching first metal layer 219 selectively to a mask that has been applied to first metal layer 219. After structuring first metal layer 219, the mask is removed again.

Figure 2I:
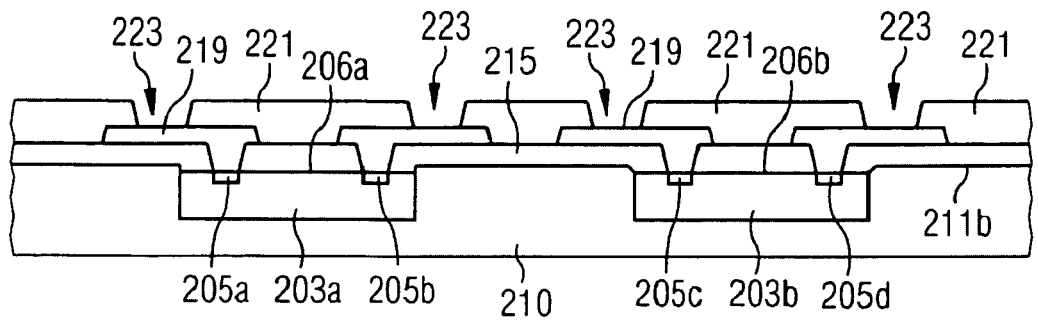

FIG. 2I depicts encapsulation workpiece 210 of FIG. 2H after a second insulating layer 221 has been applied to first metal layer 219, and after structuring second insulating layer 221 to define positions for the external contact elements 213 (see FIG. 2J) by providing second openings 223 to first metal layer 219. The material of second insulating layer 221 may be 5 to 25 micrometer. The material has the property of being non-wettable to solder materials like PbSn, SnAgCu, or other leadfree solder material. Second insulating layer 221 is also known as a solder stop layer. Second insulating layer 221 may be applied by a spin-on process by which dielectric material is spun on first metal layer 219. The thickness of second insulating layer 221 may be usually in a range between 10 and 100 micrometer. Second openings 223 may be structured by etching second insulating layer 221 selectively to a mask that has been applied to second insulating layer 221, and that is removed later after structuring.

Figure 2J:
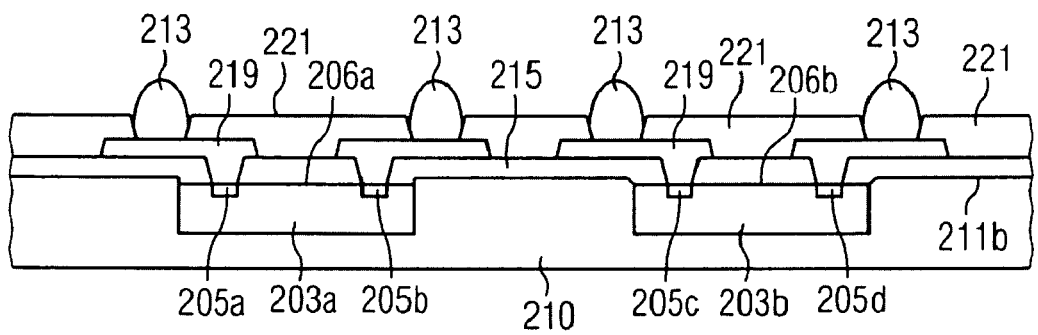

FIG. 2J depicts encapsulation workpiece 210 of FIG. 2I after external contact elements 213 have been applied to first metal layer 219. In the embodiment of FIG. 2J, the external contact elements 213 are solder balls, or solder bumps. As can be seen from FIG. 2J, the solder balls 213 are electrically connected with the contact elements 205a-205d via the first metal layer 219.

The solder balls 213 may be applied in various known ways. In one embodiment, the solder balls 213 are applied by applying solder material, e.g. PbSn, SnAgCu, or other leadfree solder selectively to second insulating layer 221. After application of the solder material, in a reflow process, the solder material is liquidized to move away from the non-wettable surface of second insulating layer 221 to form spherical balls in the second openings 223 of solder stop layer 221. In another embodiment, spherical solder balls of nearly equal size are placed into the second openings 223 of second insulating layer 221 and soldered to first metal layer 219 during a solder reflow process.

Figure 2K:
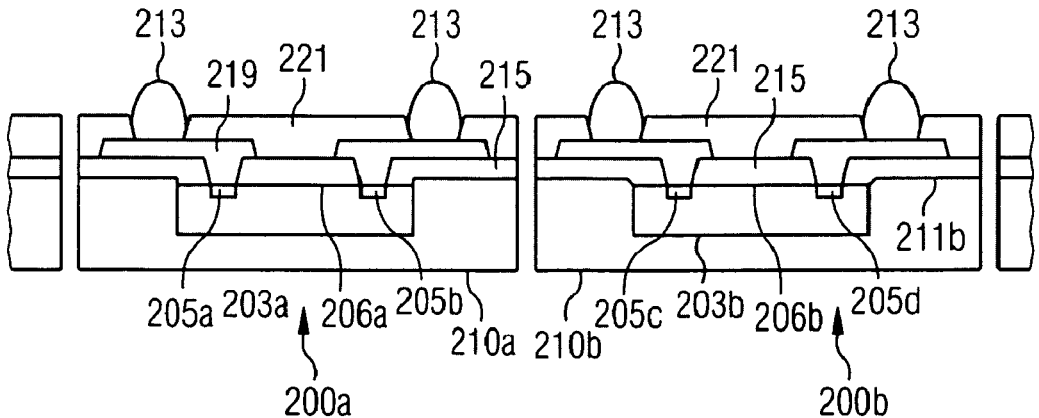

FIG. 2K depicts encapsulation workpiece 210 of FIG. 2J after singulation of the encapsulation workpiece 210. This way, multiple independent semiconductor devices 200a, 200b are obtained. Like in the previous embodiments, singulation can be carried out, e.g., by sawing the encapsulation workpiece 210 into separate encapsulation elements 210a, 210b. Alternative processes for singulation may include laser cutting, chemical etching, and related methods.

Each of the multiple semiconductor devices 200a, 200b of FIG. 2K has a chip 203a, 203b that defines a first main face 206a, 206b, and respective contact elements 205a-205d on the first main faces. Each of the multiple semiconductor devices 200a, 200b has an encapsulation element 210a, 210b embedding the respective chip and defining a lower planar surface 211b. Further, for each of the multiple semiconductor devices 200a, 200b, the first main faces 206a, 206b of the multiple chips 203a, 203b have a negative stand-off D (not visible in FIG. 2K) with respect to the respective lower planar surface 211b.

The semiconductor devices 200a, 200b of FIG. 2K also have a negative stand-off defining encapsulation step structure 220 (see FIG. 2E) connecting the first main faces 206a, 206b of the multiple chips 203a, 203b with the respective lower planar surface 211b. As mentioned before, the negative stand-off may be in the range between 5 and 50, or 5 and 100 micrometer. Since step structure 220 is made of encapsulation material, the step structure is usually softer than, for example, a step structure that a protruding silicon chip edge would provide. With a soft step structure 220, it is easier to apply a thin layers over the multiple chips 203a, 203b and the encapsulation workpiece 210 without having the thin layers break at the step structure 220. This may be important when fine metal layer structures are used to connect the external contact elements 213 with the contact elements 205a-205d on the multiple chips 203a, 203b.

FIG. 2K further depicts an array of external contact elements 213 and a first metal layer 219 structured to connect contact elements 205a-205d of the multiple chips 203a, 203b with the external contact elements 213. In one embodiment, the external contact elements 213 are applied over the first main faces 206a, 206b of the multiple chips 203a, 203b and over the lower planar surface 211b of the encapsulation element 210a, 210b. Alternatively, the array of external contact elements 213 may be applied over the lower planar surface 211b of the encapsulation element 210a, 210b only.

It should be noted that for illustrational purposes, the figures of the semiconductor devices and figures describing the processes for manufacturing the semiconductor devices in this application are kept simple. Therefore, it has not been described that, for example, the semiconductor devices may have more than one metal layer to electrically connect the contact elements of the multiple chips with the external contact elements. Further, while the figures in this application only show two contact elements per chip, the chips may have two-dimensional arrays of tens, hundreds or even thousands external contact elements depending on the application and the available space on the lower planar surface of the semiconductor devices. Further, while the external contact elements shown in the figures are solder balls, the external contact elements may also be solder bumps, studs, pillars and related elements that are suitable for making contact to external devices, like a printed circuit board. Further, each of the semiconductor devices may also have two or more semiconductor chips.

Further, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A method of manufacturing a semiconductor device, comprising:
   providing multiple chips that have been taken from different wafers, each chip comprising contact elements on a first main face of each of the multiple chips;
   applying a first layer to each of the first main faces of the multiple chips, the first layer having a first surface applied to each of the first main faces and a second surface, opposite the first surface;
   placing the multiple chips, having applied thereto the first layer, over a carrier, the second surface of the first layer facing the carrier;
   applying encapsulation material to the multiple chips and the carrier to form an encapsulation workpiece embedding the multiple chips;
   removing the carrier from the encapsulation workpiece;
   removing, at least partially, the first layer from the first main faces of the multiple chips to expose the contact elements;
   applying a plurality of insulating layers and a plurality of metallic layers to the first main faces of the multiple chips, at least one insulating layer of the plurality of insulating layers being a solder stop layer that is non-wettable to solder materials; and
   removing a portion of another at least one insulating layer of the plurality of insulating layers to provide a reminder insulating layer only on each of the first main faces of the multiple chips.

2. The method according to claim 1 further comprising opening the first layer for accessing the contact elements.

3. The method according to claim 1 wherein the first layer is applied to the different wafers from which the multiple chips are taken.

4. The method according to claim 1 wherein the first layer is applied to the first main faces of the multiple chips by at least one of a spin-on process, by attachment of a foil, by printing, and by lamination.

5. The method according to claim 1 wherein the material of the first layer comprises at least one of a polymer thermoplastic and a thermoset.

6. The method according to claim 1 wherein the first layer has a thickness of less than 100 micrometer, and more than 3 micrometer.

7. The method according to claim 1 further comprising partially removing the first layer from the first main faces of the multiple chips by structuring the first layer.

8. The method according to claim 1 further comprising applying a first insulating layer over the multiple chips.

9. The method according to claim 8 further comprising opening the first insulating layer to provide first openings to the multiple chips.

10. The method according to claim 9 further comprising applying a first metal layer over the first insulating layer and the first openings to the multiple chips.

11. The method according to claim 10 further comprising applying an array of external contact elements to the first metal layer.

12. The method according to claim 1 further comprising applying an array of external contact elements to the encapsulation workpiece, wherein the external contact elements are electrically coupled with the contact elements of the multiple chips.

13. The method according to claim 1 further comprising singulating the encapsulation workpiece for obtaining multiple semiconductor devices with the semiconductor devices comprising at least one of the multiple chips.

14. The method according to claim 1 further comprising applying external contact elements to the encapsulation workpiece, and singulating the encapsulation workpiece after application of the external contact elements.

15. The method according to claim 1 wherein the carrier comprises an adhesive tape.

16. A method of manufacturing multiple semiconductor devices, comprising:
   providing integral multiple chips taken from different wafers, each of the integral multiple chips comprising contact elements on a first main face of the integral multiple chips, and a first layer applied to each of the first main faces;
   placing the integral multiple chips over a carrier with the first layer facing the carrier;

applying encapsulation material to the integral multiple chips and the carrier to form an encapsulation workpiece comprising the integral multiple chips;

removing the carrier and the first layer from the encapsulation workpiece for opening the integral multiple chips to expose the contact elements;

applying a first insulating layer over the integral multiple chips and the encapsulation workpiece;

removing a portion of the first insulating layer to provide a reminder insulating layer only on each of the first main faces of the multiple chips;

applying a first metal layer over the integral multiple chips and the encapsulation workpiece;

applying a second insulating layer over the integral multiple chips and the encapsulation workpiece, the second insulating layer being a solder stop layer that is non-wettable to solder materials;

applying an array of external contact elements to the second insulating layer;

electrically coupling the external contact elements to the first metal layer; and singulating the encapsulation workpiece to obtain multiple semiconductor devices.

* * * * *